(12) United States Patent
Hampikian et al.

(10) Patent No.: US 6,294,223 B1
(45) Date of Patent: Sep. 25, 2001

(54) METHOD FOR ION IMPLANTATION INDUCED EMBEDDED PARTICLE FORMATION VIA REDUCTION

(75) Inventors: Janet M Hampikian, Decatur; Eden M Hunt, Atlanta, both of GA (US)

(73) Assignee: Georgia Tech Research Corp., Atlanta, GA (US)

( * ) Notice: Subject to any disclaimer, the term of this patent is extended or adjusted under 35 U.S.C. 154(b) by 0 days.

(21) Appl. No.: 08/996,968

(22) Filed: Dec. 23, 1997

(51) Int. Cl.[7] .......................... C23C 14/04; C23C 14/14; C23C 14/08
(52) U.S. Cl. .................. 427/526; 427/527; 427/529; 427/531
(58) Field of Search .................. 427/523, 526, 427/527, 529, 531, 533, 535

(56) References Cited

U.S. PATENT DOCUMENTS

| | | | | |
|---|---|---|---|---|
| 4,532,149 | * | 7/1985 | McHargue | 427/527 |
| 4,849,299 | * | 7/1989 | Loth | 427/527 |
| 4,957,591 | * | 9/1990 | Sato et al. | 427/535 |
| 4,957,771 | * | 9/1990 | Enloe | 427/527 |
| 5,051,396 | * | 9/1991 | Yamazaki | 427/527 |
| 5,102,736 | * | 4/1992 | Townsend et al. | 427/527 |
| 5,246,741 | * | 9/1993 | Ouhata et al. | 427/529 |
| 5,496,374 | * | 3/1996 | Blanchard et al. | 427/527 |
| 5,885,665 | * | 3/1999 | Gea et al. | 427/529 |

OTHER PUBLICATIONS

E.M. Hunt, et al. "The Examination of Yttrium Ion Implanted Alumina With Energy Filtered Transmission Electron Microscopy" p. 534–535, Microscopy and Microanalysis 1996, eds, G.W. Bailey, et al. no month.

E.M. Hunt, et al. "The Examination Of Calcium Ion Implanted Alumina With Energy Filtered Transmission Electron Microscopy" p. 413, Microscopy and Microanalysis, 1997. no month.

(List continued on next page.)

Primary Examiner—Marianne Padgett
(74) Attorney, Agent, or Firm—Todd Deveau; Troutman Sanders LLP

(57) ABSTRACT

A method for ion implantation induced embedded particle formation via reduction with the steps of ion implantation with an ion/element that will chemically reduce the chosen substrate material, implantation of the ion/element to a sufficient concentration and at a sufficient energy for particle formation, and control of the temperature of the substrate during implantation. A preferred embodiment includes the formation of particles which are nano-dimensional (<100 m-n in size). The phase of the particles may be affected by control of the substrate temperature during and/or after the ion implantation process.

3 Claims, 12 Drawing Sheets

OTHER PUBLICATIONS

E.M. Hunt, et al. "Imaging Of Metallic Nano–Particles Using Plasmon/Valence Energy Loss Electrons" no date, but after Mar. 27, 1997.

G.C. Farlow, et al. "Microstructural Development In The Near–Surface Region During Thermal Annealing Of $Al_2O_3$ Implanted With Cationic Impurities" pp. 1502–1519. J. Mater. Res., vol. 5, No. 7, Jul. 1990.

C.W. White, et al. "Nanocrystals and Quantum Dots Formed By High–Dose Ion Implantation" pp. 377–384, Mat. Res., Soc. Symp. Proc. vol. 386, 1996 Materials Research Society. no month.

F.L. Freire Jr., et al. "Silver Cluster Formation In Implanted $Al_2O_3$ Single Crystals" pp. 385–390, Mat. Res. Soc. Symp. Proc. vol. 396, 1996 Materials Research Society no month.

Masataka, et al. "Recrystallization–driven Migration Of Implanted Ions in Sapphire and Resultant–Oriented Precipitation", pp. 1325–1335, J. Appl. Phys. 60(4), Aug. 15, 1986; 1986 American Institute of Physics.

C.W. White, et al. "Formation Of Amorphous Layers In $Al_2O_3$ By Ion Implantation," pp. 473–478, Nuclear Instruments and Methods In Physics Research B7/8 (1985) no month.

Sklad, et al., "Implanted With Iron Ions" pp. 5895–5904, J. Mat. Sci. 27, (1992). no month.

R.F. Haglund, Jr. et al. "Picosecond Nonlinear Optical Response of a Cu:silica Nanocluster Composite" pp. 373–375, Mar. 1, 1993/ vol. 18, No. 5, Optics Letters; 1993 Optical Society of America.

Perez, et al. "Precipitation Phenomena In High–Dose Iron––Implanted Silica and Annealing Behavior" pp. 910–917, J. Mater. Res. 2(6) Nov./Dec. 1987; Materials Research Society 1987.

Fukumi, et al. "Thermal Annealing Behavior Of Ion–Implanted Silica Glass" pp. 59–64, Elsevier Science Publishers B.V. 1993 pp. 61–63 incomplete all rights reserved; Journal of Non Crystalline Solids no month.

Atwater, et al. "Ion Beam Synthesis of Luminescent SI and GE Nanocrystals In A Silicon Dioxide Matrix" pp. 409–420, Mat. Res. Soc. Symp. Proc. vol. 316, 1994 Materials Research Society no month.

* cited by examiner

METHOD FOR ION IMPLANTATION INDUCED EMBEDDED PARTICLE FORMATION VIA REDUCTION

RELATED APPLICATIONS

The subject matter of this document claims priority to co-pending and commonly assigned U.S. provisional patent application entitled, "Method for Ion Implantation Induced Nanometer Scale Particle Formation," filed Dec. 23, 1996 and accorded Ser. No. 60/033,826. The foregoing document is incorporated herein by reference.

STATEMENT OF GOVERNMENT INTEREST

This research was sponsored in part by the United States Department Of Energy under contract #DE-AC05-96OR 22464 with Lockheed Martin Energy Research Corporation, through the SHARE Program under contract #DE-AC05-76OR 00033 with Oak Ridge Associated Universities, and by the Office of Naval Research through the Molecular Design Institute at the Georgia Institute of Technology. The government of the United States of America has certain rights in this invention.

TECHNICAL FIELD

This invention relates generally to the field of the alteration of the optical properties ceramic materials via ion implantation, and more particularly to a method for ion implantation induced embedded particle formation via a chemical reduction mechanism. The invention is concerned with ion implantation into a substrate material involving controlled formation of small size (~10 nm) particles within a substrate material wherein the particles are primarily composed of the atoms of the substrate material.

BACKGROUND OF THE INVENTION

It is well established that ion implantation can alter the electrical, mechanical, and optical properties of a material. For example, the surface conductivity, surface hardness and refractive index of a substrate, such as for example a crystalline insulator, can be altered or otherwise modified through ion implantation, such as for example ion implantation-induced amorphization. More complex alterations in the optical response of ceramic materials, such as for example insulators, are also possible with ion implantation and involve altering or otherwise affecting the susceptibility and dielectric constant of the material through the formation of a dilute concentration of colloidal particles. It has been demonstrated that particles on the order of 10 nm and smaller dispersed in a dielectric medium exhibit novel optical properties by a wide range of researchers, including White, et al., Mat. Res. Soc. Symp. Proc., 316, 499 (1994); Mouritz, et al., Nuc. Inst. & Meth. B, B19/20, 805 (1987); Haglund Jr., et al., Nuc. Inst. & Meth. B, B91, 493 (1994); and Allegre, et al., J. Cryst. Growth., 138, 998 (1994), incorporated herein by reference. The small size of these particles induces electronic conditions in the material which cause the material to respond in a nonlinear fashion in response to applied electromagnetic fields. These nonlinear responses are essential for the formation of many planar waveguide devices required for integrated optical device technology, such as integrated optical computing, high bandwidth optical switching and in other areas concerned with unconventional optical responses.

Colloid formation in many materials can be induced by any mechanism that causes the introduction of a significant amount of free metal ions. Townsend, Rep. Prog. Phys., 50, 501 (1987). Ion implantation is clearly such a mechanism and particle formation via ion implantation has been demonstrated in MgO, CaO, SrO, $SiO_2$ and $Al_2O_3$. This type of particle formation involves the creation of a supersaturated region in the substrate material by ion implantation and the subsequent precipitation of the extra metal to form metallic particles. For example, ion implantation of $Al_2O_3$ with any one of a large range of ions results in the formation of particles composed of that element embedded in the substrate. Elements for which implantation induced particle formation in $Al_2O_3$ has been demonstrated include Au, Ag, Cu, Fe, Ni, Mn, Si and Ge. Farlow, et al., Rep. Prog. Phys., 50, 501 (1987); Sklad, et al., J. Mat. Sci., 27, 5895 (1992); Ohkubo, et al., J. Appl. Phys., 60, 1325 (1986); White, et al., Mat. Res. Soc. Symp., 396, 377 (1996); Magruder, et al., Appl. Phys. Lett., 62, 465 (1993); Freire, et al., Mat. Res. Soc. Symp., 396, 385, (1996); and Haglund Jr, et al., Opt. Lett., 18, 373 (1993). Similarly, ion implantation of $SiO_2$ with Si, Au, Ag, As, Cu, Fe, Ge, In, P, Sb, W or Zn result in particles composed of the respective implanted ion. White, et al., Mat. Res. Soc. Symp. Proc., 316, 499 (1994); Farlow, et al., J. Mat. Res. 5, 1502 (1990); Atwater, et al., Mat. Res. Soc. Symp., 316, 409 (1994); Tyschenko, et al., Mat. Res. Soc. Symp., 438, 453 (1997); Pan, et al., Nucl. Instrum. & Meth. B, 114, 281 (1996); Magruder, et al., Mat. Res. Soc. Symp., 438, 429 (1997); Hosono, et al., Nucl. Instrum. & Meth. B, 116, 178 (1996); Battaglin, et al., Nucl. Instrum. & Meth. B, 116, 102 (1996); Kishimoto, et al., Mat. Res. Soc. Symp., 438, 435 (1997); Perez, et al., J. Mat. Sci., 2, 91, (1987); Min, et al., Mat. Res. Soc. Symp., 405, 247 (1996); Bao, et al., Mat. Res. Soc. Symp., 438, 477 (1997); Anderson, et al., J. NonCryst. Solids, 203, 114 (1996); Mu, et al., Mat. Res. Soc. Symp., 438, 441 (1997).

This method of particle formation does have drawbacks, however. While ion implantation does allow a wider range of material combinations than traditional melt processing, there are certain combinations that have not been demonstrated using this method. Aluminum particles in $Al_2O_3$, for example, have not been shown to occur upon implantation of Al. Another deficiency of this method is that the particle size distribution of particles formed via implantation and precipitation can be quite large. Size ranges up to approximately 35 nm have been reported in some cases. Sklad, et al., J. Mat. Sci., 27, 5895 (1992). Many of the applications mentioned above require a narrower particle size distribution in order to allow for more precise control of the induced optical properties. Atwater, et al., Mat. Res. Soc. Symp., 316, 409 (1994); Tyschenko, et al., Mat. Res. Soc. Symp., 438, 453 (1997). In addition, the nature of the precipitation mechanism requires that the particles formed be the equilibrium crystallographic phase of the metal. In some cases other phases may be desired, as the electrical properties of a material can be different depending on the crystallographic structure.

Particle formation via implantation and reduction addresses these problems. It allows for the formation of certain substrate-particle systems not demonstrated with other particle formation techniques, and can produce a narrower particle size distribution. Hunt, et al., Proc. Microscopy and Microanalysis, 534 (1996); Hunt, et al., J. Mat. Sci., 32, 3393 (1997); Hunt, et al., Proc. Microscopy and Microanalysis, 413 (1997). In addition, it has been demonstrated that particles with a nonequilibrium structure can be produced with this technique.

SUMMARY OF THE INVENTION

The primary object of the invention is to provide an improved, and in some cases, the only method for the production of embedded metallic particles with a narrow size distribution that are comprised of an element of the host substrate material.

Another object of this invention is to enable the production of particles with a nonequilibrium structure.

Another object of this invention to provide a process for the formation of particles within a substrate material by ion implantation where the particles comprise atoms of the substrate material.

Another object of this invention to control the size, distribution, and orientation of the particles.

Another object of this invention is a means of ion implantation of a substrate material resulting in the formation of substrate material nanocrystals implanted at various temperatures and accelerating energies. The size, composition, and distribution of the colloidal particles varies with the implantation temperature and accelerating energy.

Another object of this invention is a method to anneal implanted substrates at high temperature to recrystallize the amorphous region of the substrate, to induce formation of crystallites of a metastable alloy, and to partially align internal grains of alloys. The extent to which these effects occur varies with the temperature and length of time of the annealing treatment.

The foregoing and other objects and advantages are accomplished in the present invention by a method for ion implantation induced embedded particle formation via a chemical reduction mechanism. The invention is comprised of the ion implantation of a substrate with a sufficient concentration of an element that will chemically reduce that substrate. The structure of the resulting particles can be affected by controlling the substrate temperature during the ion implantation procedure.

DESCRIPTION OF THE DRAWING FIGURES

Figures 13A, 13B, 13C:
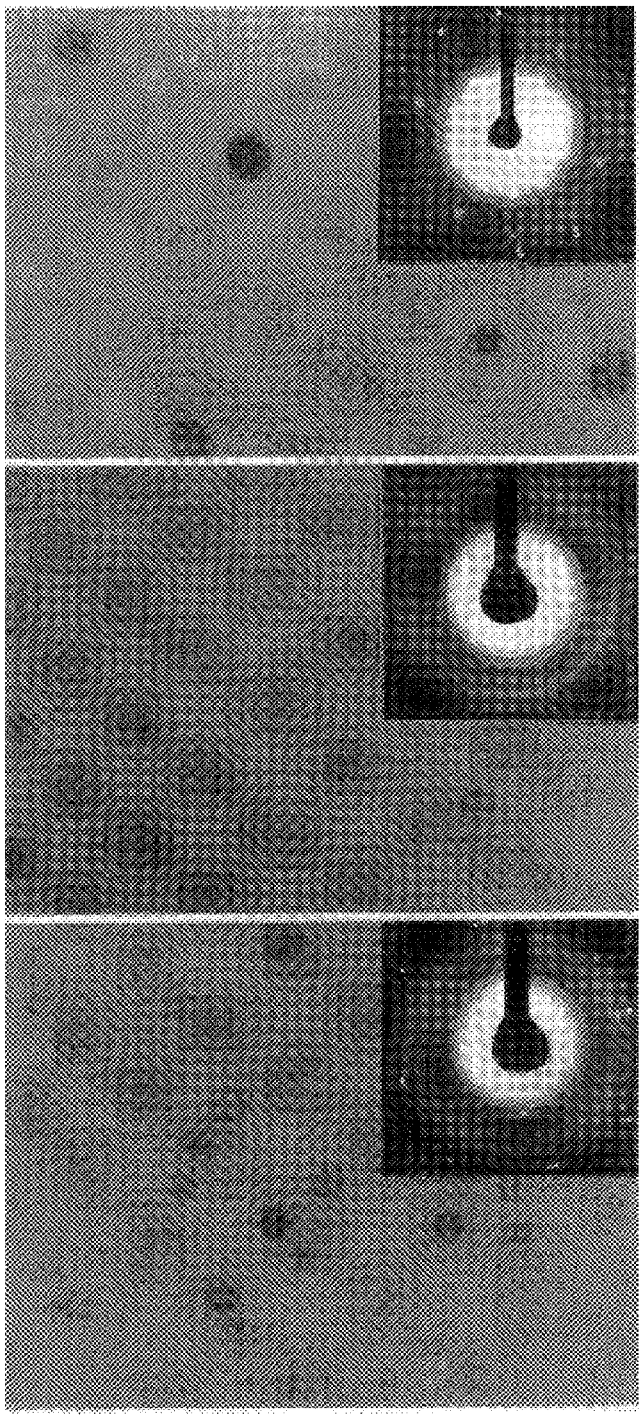

FIG. 13 are TEM micrographs showing the microstructure of (a) the 150 keV $Y^+$ implantation, (b) the 50 keV $Ca^+$ implantation and (c) the 70 keV $Ca^+$ implantation, with associated diffraction patterns.

FIG. 14 shows the energy loss spectra from (a) the 150 keV $Y^+$ implantation and (b) the 70 keV $Ca^+$ implantation showing the alumina plasmon loss feature at ~25 eV. The metallic aluminum plasmon loss feature at 15 eV is present only in the spectra obtained from particle-bearing material, indicating that the aluminum comprising the particles is metallic in nature.

Figures 15A, 15B, 15C:
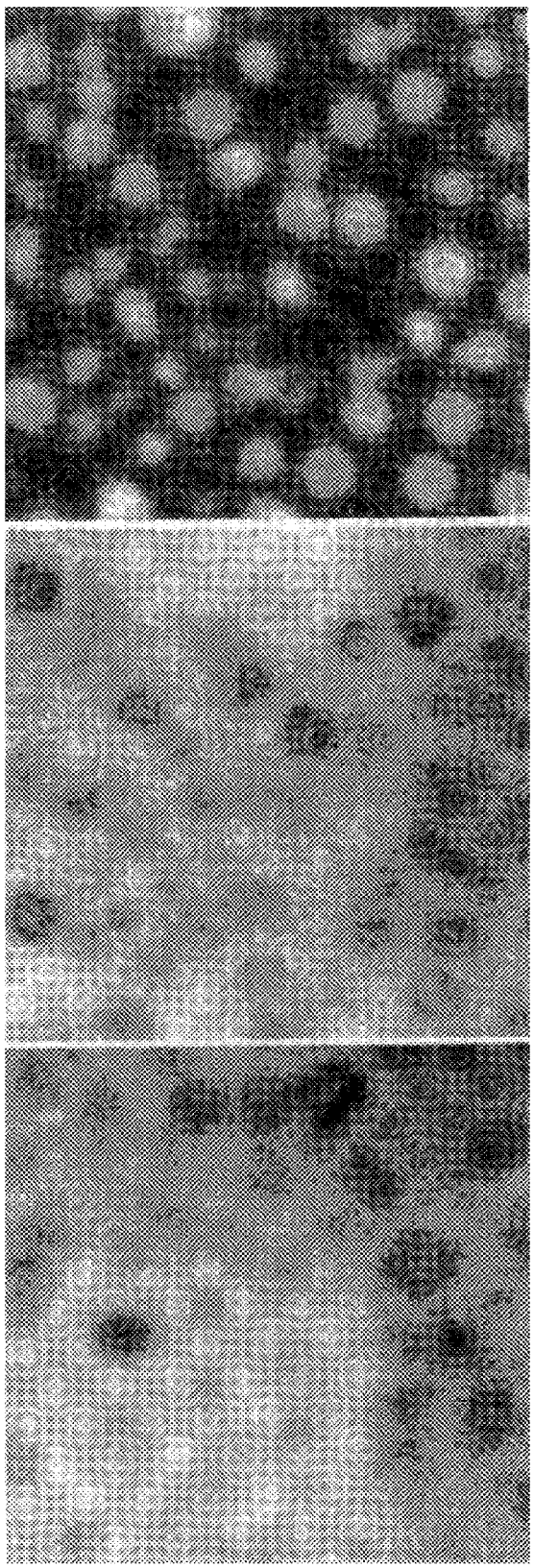

FIG. 15 shows the energy filtered TEM micrographs of the 50 keV $Ca^+$ implantation from (a) The 15 eV-loss image, (b) the 25 eV-loss image and (c) an elemental map of oxygen from an adjacent region.

DETAILED DESCRIPTION OF THE PREFERRED EMBODIMENTS

Detailed descriptions of the preferred embodiment are provided herein. It is to be understood, however, that the present invention may be embodied in various forms. Therefore, specific details disclosed herein are not to be interpreted as limiting, but rather as a basis for the claims and as a representative basis for teaching one skilled in the art to employ the present invention in virtually any appropriately detailed system, structure or manner.

This invention comprises the ion implantation of a substrate material with an element specifically chosen for its ability to chemically reduce that substrate material. The reduction of the substrate material results in the introduction of a significant amount of free metal ions into a relatively small volume beneath the substrate surface. These metal ions cluster together to form metallic particles embedded in the substrate material. The concentration and energy of the reactive implanted element are critical parameters that must be determined for each substrate-ion system. The choice of the element to be implanted into the substrate can be made on the basis of a simple thermodynamic prediction of the free energy of the reaction between the implanted ion and the substrate material. The following linear approximation of the free energy may be used, so long as there is no part of the system that experiences a change in physical state in the temperature range over which the implantation will be carried out:

$$\Delta G^O = \Delta H^O + \Delta S^O T$$

where: $\Delta G^O$=standard free energy of reaction $\Delta H^O$=standard enthalpy change of the reaction $\Delta S^O$=standard entropy change of the reaction T=temperature at which reaction takes place in Kelvin This embodiment of the invention has been applied to the substrate-ion system $Al_2O_3$ (alumina) and $Y^+$ (singly charged yttrium ions). It has been demonstrated for this system that the implantation of $5 \times 10^{16}$ $Y^+/cm^2$ at an accelerating energy of 150 keV into single crystal alumina substrates results in the formation of spherical particles with a face-centered cubic structure and an experimentally determined lattice parameter of 0.412 nm±0.002 nm. These particle have an average size of 12.5 nm±0.3 nm and range in size from 11–14 nm. It has been shown using chemically sensitive techniques that the particles are comprised of metallic aluminum. These results are reported in Hunt et al., J. Mat. Sci. 32, 3393 (1997) and Hunt, et al., Proc. Microscopy and Microanalysis, 534 (1996), both incorporated herein and made a part hereof by this reference. This embodiment has also been applied to the substrate-ion system $Al_2O_3$ (alumina) and $Ca^+$ (calcium). It has been demonstrated for this system that the implantation of $5\times10^{16}$ $Ca^{30}$/$cm^2$ at an accelerating energy of 70 keV into single crystal alumina substrates results in the formation of spherical particles with a face-centered cubic structure and an experimentally determined lattice parameter of 0.411 nm+0.002 nm. These particles have an average size of 7.5 nm±0.3 nm and range in size from 6–10 nm. It has been shown using chemically sensitive techniques that the particles are comprised of metallic aluminum. These results are reported in Hunt, et al., Proc. Microscopy and Microanalysis, 413 (1997) and Hunt, et al., Surf. Coatings and Tech., in press, both incorporated herein and made a part hereof by this reference.

A special embodiment of this invention has been applied to the substrate-ion system $Al_2O_3$ (alumina) and $Y^+$ (singly charged yttrium ions) at reduced substrate temperatures. It has been demonstrated for this special embodiment that the implantation of $5\times10^{16}$ $Y^+$/$cm^2$ at an accelerating energy of 150 keV into single crystal alumina substrates held at −192° C. results in the formation of predominantly amorphous spherical particles shown by chemically sensitive techniques to be composed of metallic aluminum. These results have not yet been published by the inventors, however; publication is planned in the near future.

In all the above embodiments the selection of the implanted ion has accomplished by the examination of the free energy of the reaction of the ion and the substrate. The reduction reactions of both yttrium and calcium with alumina have a negative free energy, indicating that the reactions are thermodynamically possible. Following are some more specific disclosures and examples of the invention to assist one skilled in the art with understanding the invention. The specific disclosure and examples below are not meant to limit the invention, but only to provide additional detail fro a more complete understanding of the invention.

The formation of colloidal particles may be achieved using ion implantation, and in many cases, the size and distribution of the particles can be controlled by careful post-implantation annealing treatments. Such treatments are disclosed in White, et al., Mat. Res. Soc. Symp. 316 (1994) 487; Sklad, et al., J. Mat. Sci. 27 n.21 (1992) 5895; Fukumi, et al., J. Non-Cryst. Solids 163 (1993) 59; and Perez, J. Mater. Res. 2 n.6 (1987) 910; incorporated herein and made a part hereof by this reference. The present invention creates a colloidal microstructure by ion implantation into single crystal substrate material, and also modifies the microstructure through post-implantation annealing.

Implantation results in a chemically modified layer which is limited in extent by the range/depth of the implanted ion. In experiments disclosed in Ziegler, Transport of Ions in Matter, IBM Research 28-0, Yorktown, N.Y. 10598, (1992), incorporated herein and made a part hereof by this reference, the yttrium ions come to rest within approximately the first 100 nm of the substrate (for the 150 keV implant), with the peak of the Gaussian profile at approximately 50 nm. The dimension of the affected layer thus necessitates careful preservation of the implanted surface during sample preparation and testing, and also the use of specialized characterization techniques, including analytical electron microscopy, energy filtered transmission electron microscopy, and Rutherford backscattering spectrometry; as disclosed by Potter, et al., Materials Characterization 28, 89 (1992); incorporated herein and made a part hereof by this reference.

This present invention provides a process for the implantation of singly charged ions into a single crystalline substrate which induces the formation of a surface amorphous layer containing finely distributed, fcc, substrate material-rich particles with an average diameter of 12–13 nm. Further, the invention provides for post implantation annealing treatments to gradually recrystallize the substrate with increasing time and temperature. The process results in an evolution in the microstructure of the annealed samples, which is summarized in FIG. 10. A small amount of recrystallization (e.g., 1000° C., 90 minutes) is accompanied by the formation of ~25 nm precipitates of a metastable $Y_3Al$ in the implanted region. Annealing at 1100° C. for the same amount of time results in microstructure of partially aligned grains embedded in the substrate and the continued existence of the metastable (e.g., $Y_3Al$) precipitates. Upon total recrystallization of the amorphous layer, the microstructure consists of partially oriented internal grains as well as larger, faceted rectangular surface grains with aspect ratios ranging from 1:5 to 1:1.5. Both internal and external grains exhibit the following orientation relationship with respect to the matrix: [001] ∥ [2201].

The ion can be the positively charged atom of any element of the Periodic Table. Suitable ions include: $In^+$, $Y^+$, $Al^+$, $Mn^+$, $Ni^+$, $Fe^+$, $Zr^+$, $Mg^+$, $Zn^+$, and $Ga^+$. While process parameters may be different for any given ion, such parameters are ascertainable through routine experimentation by those skilled in the art. Yttrium ($Y^+$) is the preferred ion. The ion should be selected so that the reduction reaction with the substrate is thermodynamically feasible.

The substrate can be an amorphous or crystalline solid oxide. Ceramics such as $Al_2O_3$, MgO, $SiO_2$, and $ZrO_2$, for example, are suitable for ion implantation. The preferred substrate is alumina. As with the implanted ion, the substrate material should be chosen so that a reduction reaction involving the ion and the substrate is thermodynamically favorable.

The implantation temperature can range from 50 Kelvin to the melting point of the substrate. The implantation temperature will have an effect on the size and distribution of the formed particles. It has been found that the lower the implantation temperature, the smaller the particles.

The accelerating potential used can range from 10 keV to 1000 keV. Accelerating potentials under 50 keV are not preferred as particle formation may not occur. The preferred accelerating potential is 100 keV to 200 keV. The higher the acceleration energy, the deeper the ion will enter into the substrate.

It is believed that upon implantation of the ion, a reduction reaction occurs within the substrate, thereby forming particles comprising the atoms of the substrate material. For example, when $Y^+$ is implanted into an alumina substrate, the reduction reaction results in the formation of yttria and predominately metallic aluminum particles within the substrate that are oxygen-poor relative to the substrate. As one skilled in the art is aware, yttria is more thermodynamically stable than alumina under certain conditions.

The following non-limiting examples are presented to further illustrate the present invention.

EXAMPLE I

1. Procedure

The 1123 single crystal alumina substrates (99.99% purity) used in this study were obtained with an optical grade surface polish from Saphikon Inc. The 0.7 mm thick substrates were cut into 10 mm×10 mm samples and annealed at 1500° C. for 80 hours to remove residual polishing damage and ensure a crystalline structure throughout the substrate. The crystallinity of the substrate surface was demonstrated by electron channeling in a scanning electron microscope using a backscattered electron detector and 10 keV electrons. Implantation with singly charged yttrium ions ($Y^+$) was performed using an ion implanter coupled with a high vacuum end station, with the pressure during implantation maintained below $\approx 5 \times 10^{-6}$ Pa. The accelerating potential was selected to be either 100, 150, or 170 keV, and yielded $Y^+$ ions at those energies. Each substrate received a fluence of $5 \times 10^{16}$ yttrium ions per square centimeter measured with a Farady cup, and were implanted on one side only. In order to minimize beam heating, substrates were attached to water-cooled copper heat sinks. Post-implantation annealing treatments were carried out in flowing laboratory air at 1000, 1100, 1250 and 1400° C. for times ranging from 20 to 90 minutes. The samples were placed, implanted surface up, onto a high purity polycrystalline alumina support plate and put in the furnace after it had stabilized at the appropriate temperature.

Rutherford backscattering spectroscopy (RBS) and ion channeling (RBS-C) with a 1.5 MeV beam of $^4He^+$ was used to examine the laterally averaged chemical profile of yttrium versus energy(depth below the implanted surface) and the implantation-induced damage to the crystalline lattice. These experiments were carried out at the Oak Ridge National Laboratory Surface Modification and Characterization Facility (SMaC Facility). The extent of this damage was further investigated through Knoop microhardness measurements which were carried out in accordance with the ASTM standard for microhardness testing (E 384–89, incorporated herein by reference), employing a Lecco DM-400 hardness tester. Scanning electron microscopy was also used to examine the implanted surfaces. The implanted surface microstructures and chemical compositions of selected samples were examined with 200 keV electrons in a field emission gun transmission electron microscope (TEM) equipped with an energy dispersive X-ray spectrometer (EDX). The metallic nature of the as-implanted microstructural features was established with energy filtered transmission electron microscopy (EFTEM) by using a 5 eV energy window to isolate the aluminum metal plasmon loss peak at ~15 eV. This analysis was carried out at Oak Ridge National Laboratory.

2. As-Implanted Condition

Figure 1:
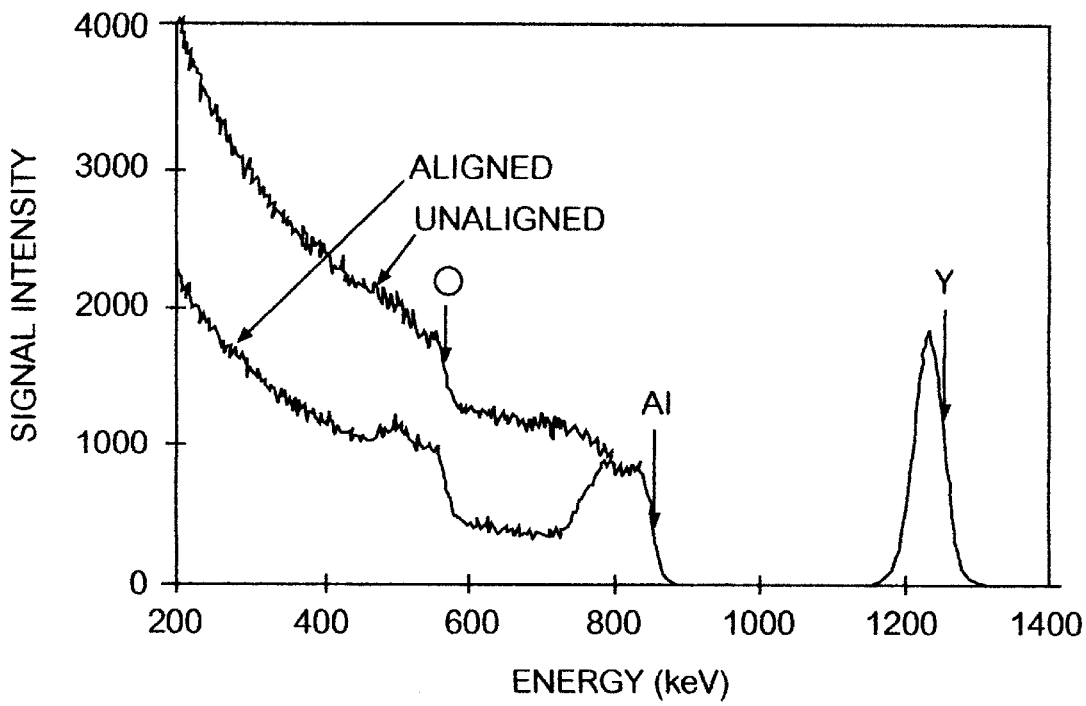
FIG. 1 is a schematic representation of the aligned and unaligned RBS spectra for sapphire implanted with $5 \times 10^{16}$ $Y^+/cm^2$ at ambient temperature and an energy of 150 keV.
Figure 2:
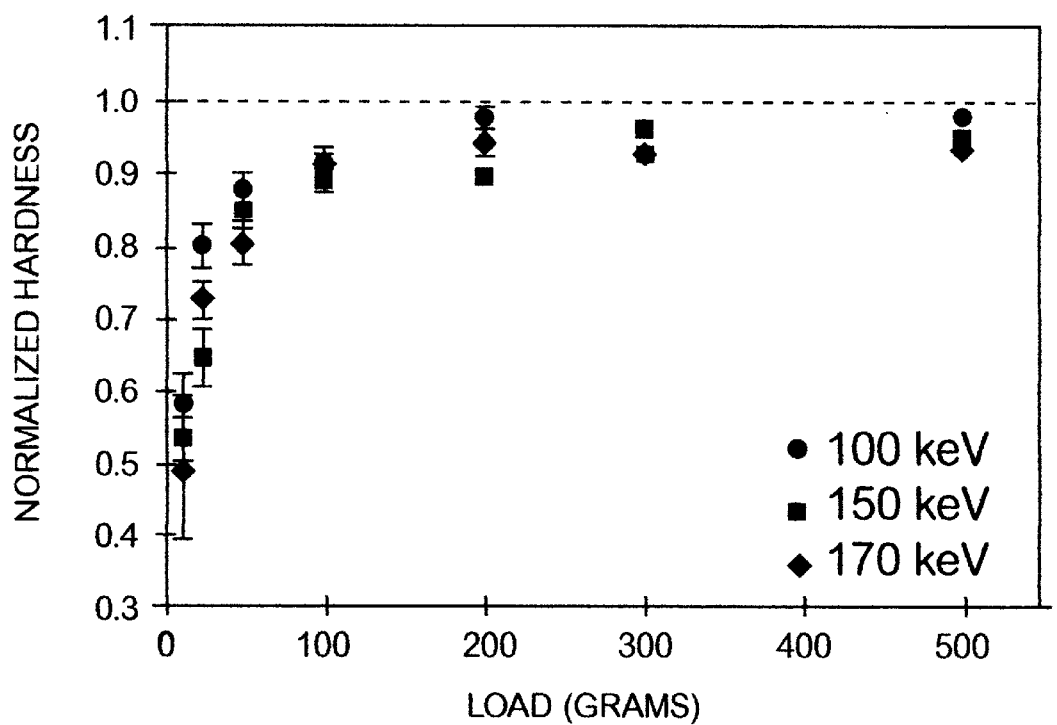
FIG. 2 is a schematic representation of normalized Knoop hardness values as a function of load for the substrates implanted with $Y^+$ ions with energies of 100, 150 and 170 keV.

Yttrium ions implanted into (1123) alumina at energies of 100, 150 and 170 keV to a fluence of $5 \times 10^{16}$ $Y^+/cm^2$ produced alumina surfaces which were light bronze in color. Typical RBS spectra are presented in FIG. 1, obtained from alumina implanted with yttrium at 150 keV. The spectrum labeled "aligned" was collected from a sample which was oriented to allow channeling, seen by the lower yield at low energies. At the aluminum edge, however, the aligned spectrum is dechanneled, indicating the presence of heavily damaged material in the surface region. The thickness of the damaged layer is ~120 nm, calculated using a depth calibration based on the stopping power of alumina. To determine the extent of this damage, Knoop microhardness values were recorded for the three implanted surfaces as well as the unimplanted back-surfaces of the same samples. FIG. 2 represents these values as a plot of load vs. nonnalized hardness (unimplanted hardness/implanted hardness). The as-implanted surface hardnesses for all three samples are lower than that of unimplanted substrate material, as indicated by the near surface (low load) normalized hardness values being much less than unity. This corresponds to "absolute softening", which is described in detail by Burnett and Page (Burnett and Page, Rad. Eff. 97 (1986) 283; Burnett and Page, J. Mat. Sci. 19 (1984) 3524; and Burnett and Page, J. Mat. Sci. 20 (1985) 4624; incorporated herein and made a part hereof by this reference), and which, when taken in conjunction with the dechanneled region seen in FIG. 1, indicates the presence of an amorphous region which extends to the sample's surface. This result is in contrast with the prior art done using relatively heavy ions implanted into alumina by Farlow, et al., J. Mat. Res. 5 n.7 (1990) 1502; and White, et al., Nuc. Inst. & Meth. B B7/8 (1985) 473, in which either no amorphous layer is reported for similar and slightly larger ion doses administered at ambient temperature, or the implantations cause the formation of buried amorphous layers.

Figure 3:
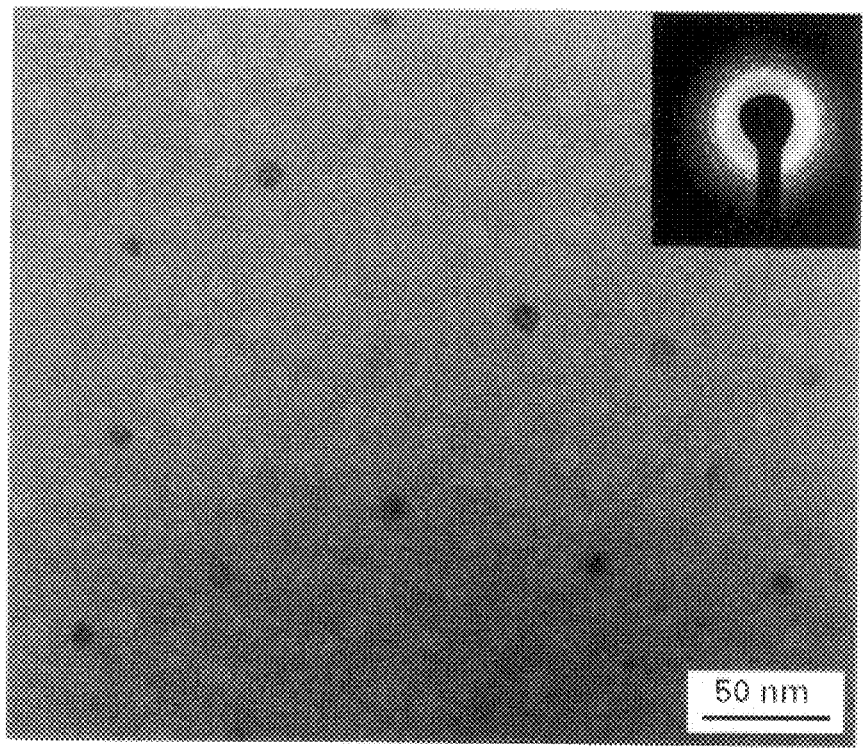
FIG. 3 is a TEM bright field image of particles in the 150 keV as-implanted sample.
Figure 4:
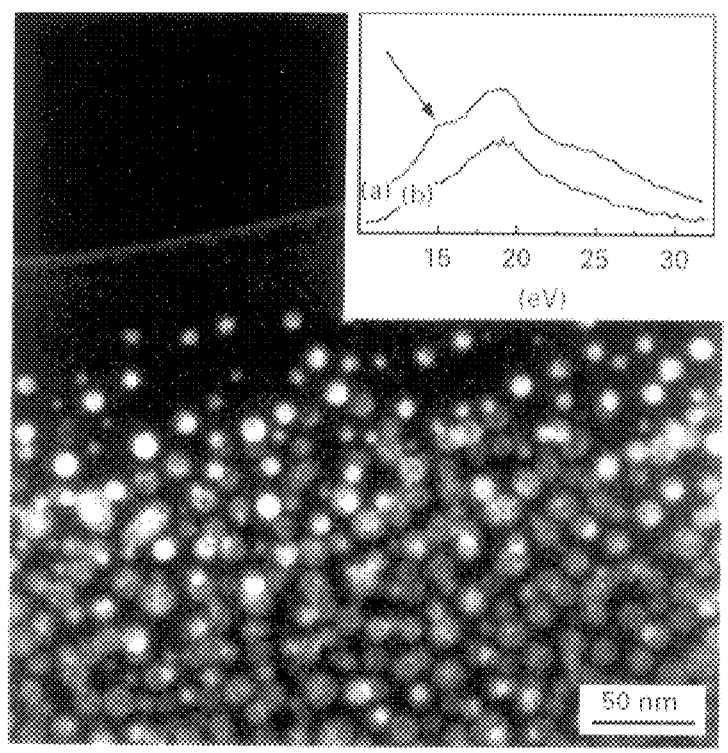
FIG. 4 is a EFTEM image formed using a 5 eV energy window centered on the 15 eV plasmon loss peak associated with metallic aluminum.

Transmission electron microscopy of as-implanted plan view samples prepared by polishing and ion milling through the sample's back side to the implanted surface confirmed the presence of amorphous material at the sample surface, as seen in FIG. 3. In addition to the amorphous phase, the existence of lightly diffracting nanosized crystals ($\approx$12–13 nm) in plan view samples of the two higher energy implants (150 and 170 keV) was also revealed. The nanocrystals are finely distributed, and exhibit a face-centered cubic structure with a lattice parameter of $a_o = 0.412 \pm 0.002$ nm. Chemical analysis (EDS) shows qualitatively that these nanocrystals are rich in aluminum and yttrium and poor in oxygen relative to the surrounding amorphous matrix. These nanocrystals have been shown by Hunt, et al., Abstract Submitted to the Microscopy and Microanalysis '96 Conference, (1996), incorporated herein by reference, to be composed of predominantly metallic aluminum through the use of energy filtered TEM (EFTEM). A typical image formed using this technique is shown in FIG. 4. Two energy-loss distributions are shown in the inset to FIG. 4; in (a) the spectrum is from an area containing nanocrystals, and in (b), the spectrum is from pure alumina. The image in FIG. 4 was formed using a 5 eV window centered on the plasmon peak of metallic aluminum (arrowed in the inset of FIG. 4), and appropriate background subtraction. The illuminated particles thus contain metallic aluminum. Further analysis by EFTEM, in Hunt, et al., Mat. Res. Soc. Symp. Proc. 396 (1996) p.403; incorporated herein and made apart hereof by this reference, confirms that the particles are oxygen deficient in comparison with the matrix material, and that the particles are not yttria. Any measurement of the particle size from FIG. 4 would be imprecise due to the loss of resolution caused by the use of the relatively large 5 eV energy window.

The similarity between the crystallography of the nanocrystals (fcc, $a_o = 0.412 \pm 0.002$ nm) and that of pure aluminum (fcc, $a_o = 0.40497$ nm), coupled with the qualitative EDS and EFTEM results, indicate that the nanocrystals are predominantly metallic aluminum with a slightly dilated lattice parameter, due to the presence of yttrium. The equilibrium phase diagram predicts negligible solubility of yttrium in aluminum at room temperature. ASM Handbook 3, "Alloy Phase Diagrams", ed. H. Baker, ASM International, (1992), incorporated herein and made a part hereof by this reference. However, ion implantation is a non-equilibrium process and non-equilibrium phases are not uncommonly reported. The yttrium is trapped in solid solution, since diffusion at room temperature in aluminum is negligible. Thus, the amount of yttrium in solid solution with aluminum may be estimated using a Vegards law approach. Such an analysis yields a yttrium concentration of ~7%.

Figure 5:
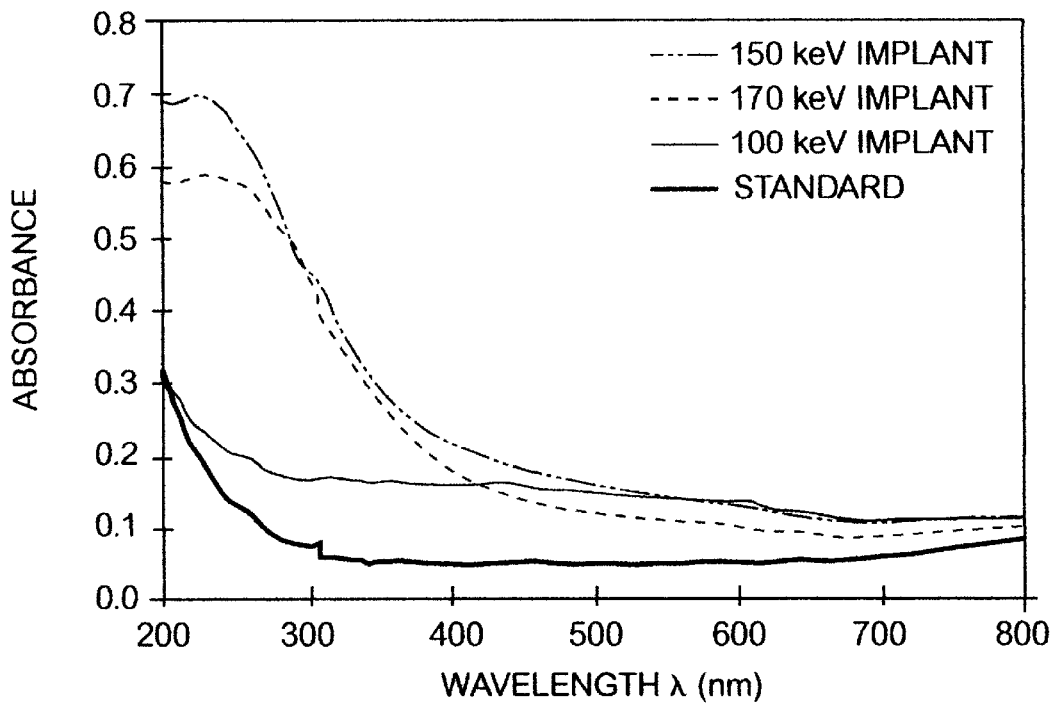
FIG. 5 is a schematic representation of absorption as a function of incident wavelength for the substrates implanted with $Y^+$ ions with energies of 100, 150 and 170 keV, and a sapphire standard.

TEM performed on the 100 keV implanted samples did not reveal the particles which were present in the higher energy implants, although the amorphous phase was evident from electron diffraction. In order to verify this finding, absorbence spectra of all three implanted samples and an unimplanted alumina standard were recorded, as shown in FIG. 5. The absorption feature noted at approximately 24 nm in the spectra from the two particle-bearing samples does not appear in the unimplanted and 100 keV implanted spectra. Since the 100 keV sample was not found to contain the nanocrystalline particles with TEM, although it did contain the amorphous phase, and an equal amount of yttrium, the absorption feature appears to be a result of the presence of Al-Y particles. The discontinuity apparent in the absorption curves at approximately 30 Å is due to an intermittent problem with the spectrophotometer involving an illumination source change.

3. Evolution of Microstructure Due to Annealing

Figure 6:
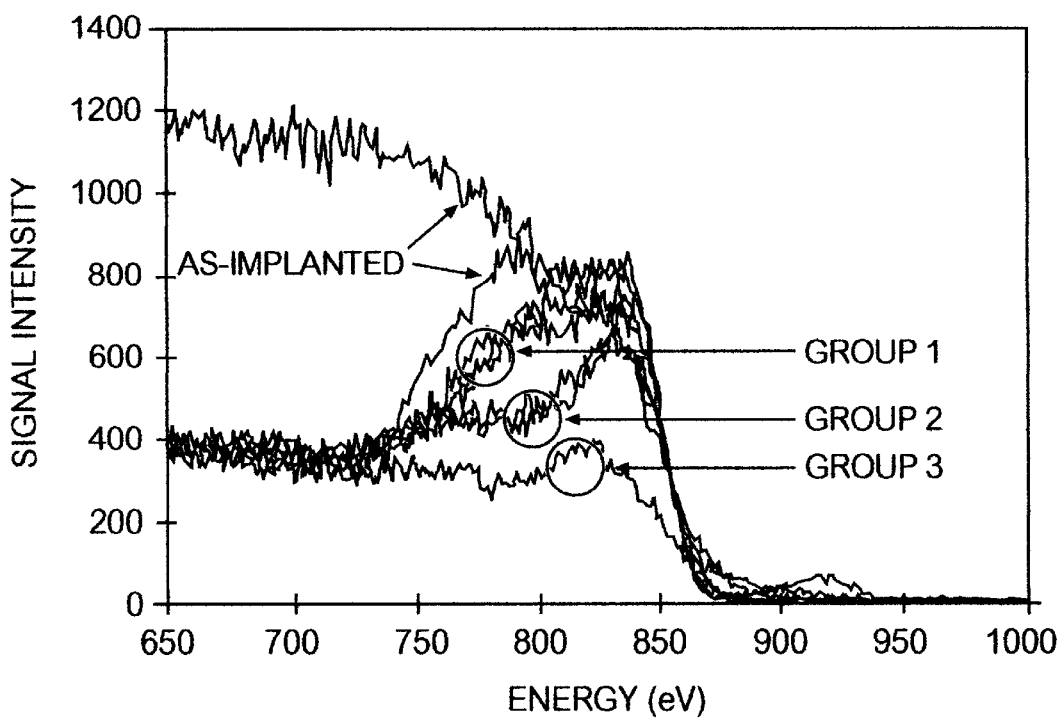
FIG. 6 is a schematic representation of a RBS spectra: 150 keV, aligned and unaligned as-implanted, and aligned annealed samples.

All annealing treatments result in the loss of the bronze coloration due to implantation (substrates revert to transparency). A gradual recrystallization of the damage caused by the implantation was shown by RBS and ion channeling, as seen in FIG. 6 which contains the aligned aluminum-edge portions of the RBS spectra for the annealed samples. For comparative purposes, the two spectra from FIG. 1 are also present in FIG. 6. The channeling results are roughly divided into three major groups by similarity in the degree of recrystallization. The approximate average thickness of the dechanneled regions (amorphous regions) for groups 1, 2 and 3 are 100 nm, 45 nm, and 5 nm (essentially totally recrystallized), respectively. Accompanying this gradual re- crystallization, there is an evolution in the microstructure of these samples which will be described below. One sample from each recrystallization grouping was chosen to be examined with TEM.

Figure 7:
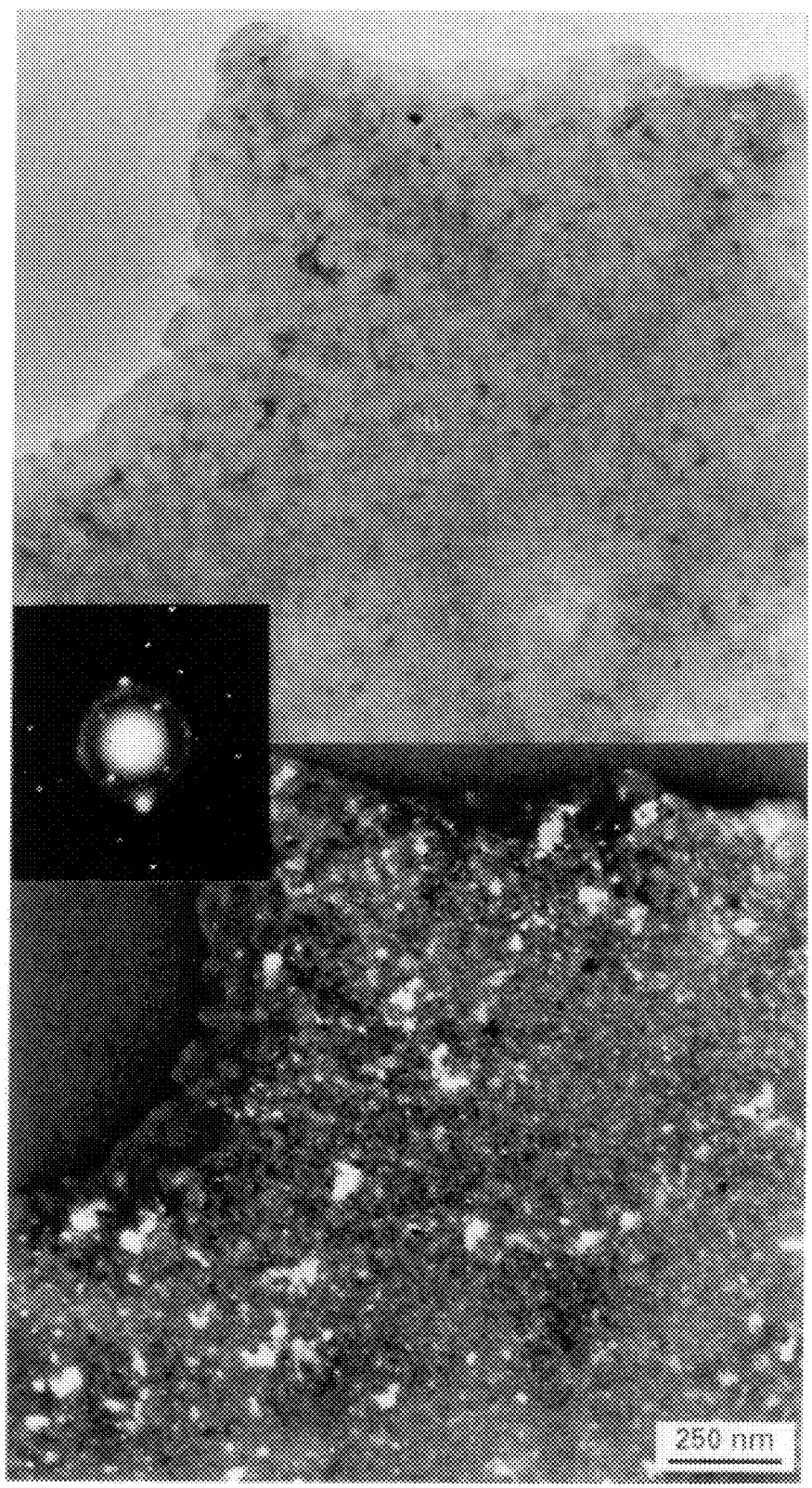
FIG. 7 is a TEM bright and dark field images of the 1000° C., 90 minute annealed sample, and associated diffraction pattern. Dark field image was formed using the indicated portion of the diffraction rings.

The microstructure of the first sample (implanted at 150 keV, and annealed 90 minutes at 1000° C.), shown in FIG. 7, contains nano-sized crystals in an amorphous matrix. There are, however, a number of differences. The annealed crystals are larger than the crystals in the as-implanted case, with an average size of 22.0 nm±3.1 nm as opposed to an average as-implanted particle size of 12.5 nm±0.78 nm. The diffraction pattern resulting from an area containing these particles shows a polycrystalline ring pattern, shown in the inset of FIG. 7, that differs from the FCC ring pattern found in the as-implanted state shown in FIG. 3. Using the matrix spots also present in the pattern as an internal standard with which to calibrate the camera length, the d-spacings for this new phase were calculated, as tabulated in Table 1. The resulting list of d-spacings identify the new material as $Y_3Al$, a metastable phase with a primitive cubic crystal structure and a lattice parameter of 0.4818 nm, which matches the experimental lattice parameter of 0.481 nm±0.003 nm very well. It should be noted that the FCC implanted particles and the ordered simple cubic metastable particles have an approximately constant amount of aluminum. Assuming ~7% yttrium is present in the as-implanted particles as found by Vegard's analysis the growth of the particles can be accounted for by the increase in yttrium content, presumably the result of diffusion. This does not constitute direct evidence for the formation of $Y_3Al$ from the as-implanted fcc particles, however, it does suggest it is possible.

TABLE 1

Comparison of Experimental Pattern,
$Y_3Al$ and $Al_5Y_3O_{12}$ d-spacings (in nm)

| experimental d-spacings | $Y_3Al$ d-spacings | $Al_5Y_3O_{12}$ d-spacings |
| --- | --- | --- |
|  |  | 0.4905 |
|  | 0.482 |  |
|  |  | 0.4247 |
|  | 0.341 |  |
|  |  | 0.321 |
|  |  | 0.3002 |
| 0.278 | 0.2781 |  |
|  |  | 0.2687 |
|  |  | 0.2561 |
| 0.241 | 0.02409 | 0.2452 |
|  |  | 0.2355 |
|  |  | 0.2192 |
| 0.207 | 0.2155 | 0.2122 |
| 0.1917 | 0.1967 | 0.1947 |
|  |  | 0.1899 |
|  |  | 0.1853 |
|  |  | 0.177 |
|  |  | 0.1733 |
| 0.168 | 0.1703 | 0.1698 |
|  |  | 0.1665 |
| 0.162 | 0.1606 | 0.1633 |
|  |  | 0.1604 |
| 0.152 | 0.1524 | 0.1524 |
|  |  | 0.15 |
|  |  | 0.1478 |
| 0.148 | 0.1453 | 0.1456 |
|  |  | 0.1435 |
|  |  | 0.1414 |
| 0.139 | 0.1391 | 0.1396 |

Figure 8:
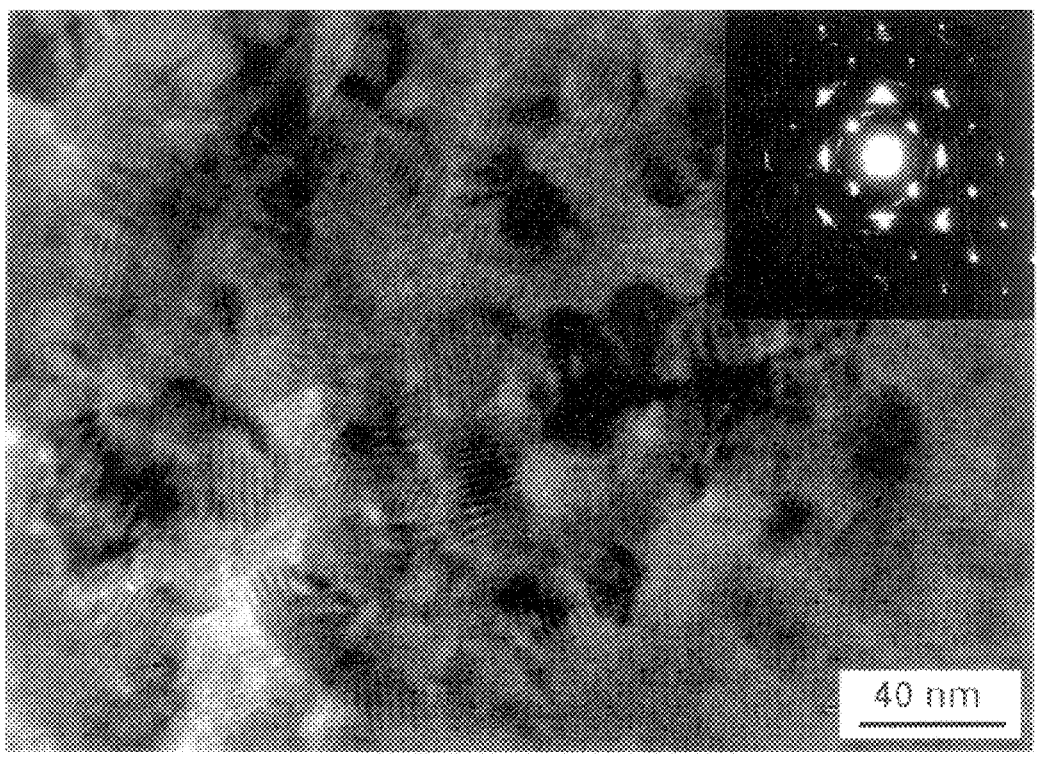
FIG. 8 is a TEM bright field image of the 1100° C., 90 minute annealed sample, and associated diffraction pattern.

There is also the possibility that these crystals could be $Al_5Y_3O_{12}$. This type of phase (usually $MAl_2O_4$ or $MAlO_3$) is known to form as a result of implantation of Ga, Mn, Ni, Cu, Zn, Co, and Fe into alumina, followed by annealing. However, the experimental diffraction data support the identification of the metastable $Y_2Al$ phase. The sample from group two which was examined (implanted at 150 keV and annealed 90 minutes at 1100° C.), represents a large step in the recrystallization process in that the amorphous layer in this sample has been reduced to approximately 40% of its original thickness. This sample exhibits a very different microstructure than the previous one, as seen in FIG. 8. There are three separate microstructural elements which make up this sample. Each aspect can be identified through analysis of the associated diffraction pattern, as seen in the inset of FIG. 8. The rather complex pattern can be broken down into parts corresponding to three elements as follows. The strong regularly occurring spots represent the recrystallized matrix material. This pattern matches that of the unimplanted substrate material. There are faint spotty complete rings discernible in this pattern as well. They match the rings of the $Y_3Al$ pattern seen in FIG. 7. Although the particles are not as evident in the bright field images of this sample their presence is confirmed by dark field imaging (not shown). Measurements taken from dark field images indicate that these particles range from ≈8–13 nm in diameter. This represents a decrease in particle diameter of approximately 50% relative to the group 1 sample. The arcs adjacent to the matrix spots in the diffraction pattern of FIG. 8 are a result of the formation of irregularly shaped, but oriented $Y_2O_3$ precipitates. The [001] $Y_2O_3$ direction is parallel to the substrate normal (the [1123] alumina direction). The experimental pattern of arcs is the superposition of two $Y_2O_3$ patterns rotated by 90° with respect to each other. The pattern "spots" appear as arcs (not as discrete spots) due to imperfect coherence between the precipitate grains themselves and between the grains and the matrix material. This slight misalignment is caused by a slight rotation about [001], which also causes the Moire fringes evident in the microstructure.

Figure 9A:
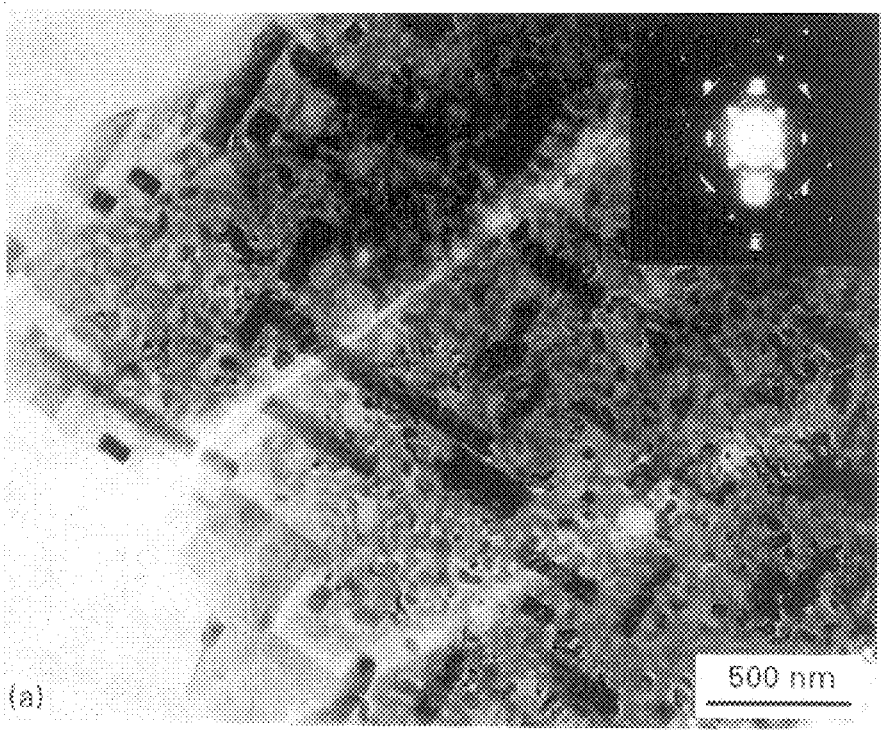
FIG. 9a is a TEM of the 1400° C., 60 minute annealed sample.
Figure 9B:
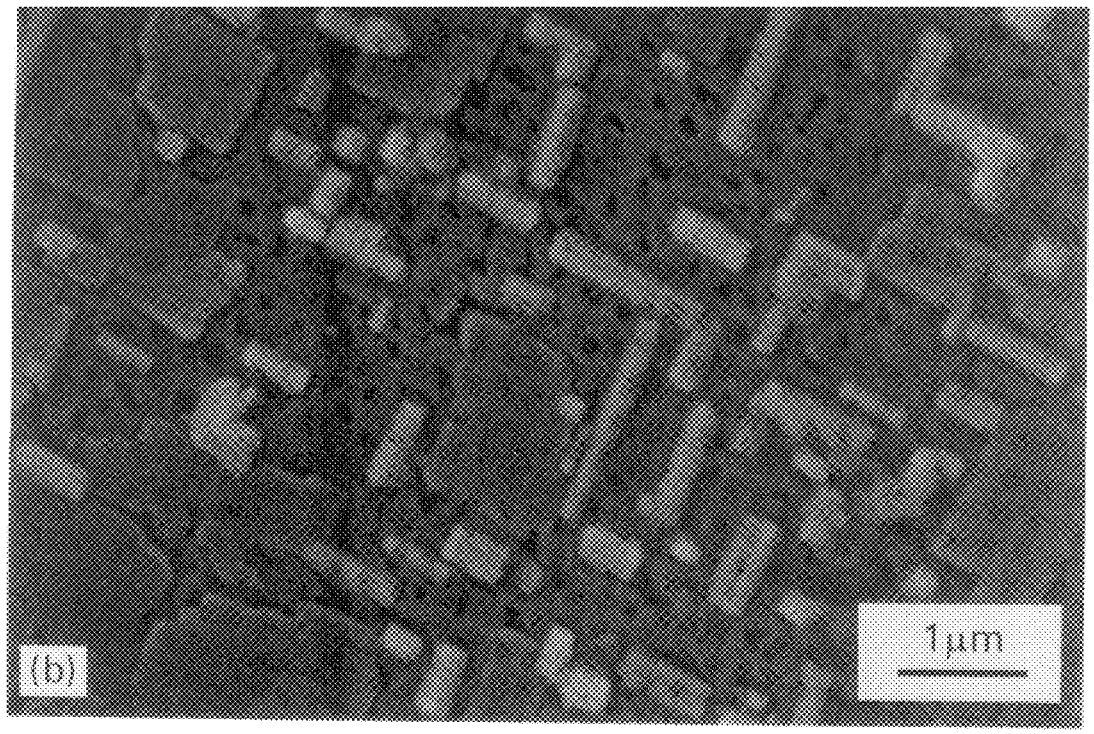
FIG. 9b is a SEM image of the surface of the 1400° C., 60 minute annealed sample.

The group 3 sample which was examined (implanted at 150 keV and annealed 60 minutes at 1400° C.) has a microstructure and diffraction pattern very similar to those discussed for the previous sample, with two significant differences, as seen in FIG. 9. First, the polycrystalline rings indicating the presence of the randomly oriented $Y_3Al$ precipitates are now absent from the diffraction pattern, as seen in the inset to FIG. 9a. Secondly, TEM examination reveals the presence of two new forms of precipitate; one large and relatively square, the other elongated. The elongated grains have aspect ratios ranging from 1:1.5 to 1:5. Both precipitate types are faceted and appear to be highly oriented with respect to the surrounding grains. Dark field imaging of this sample shows that the surface precipitates grow with their facets parallel to one of the two unique [400] directions. High resolution imaging was possible on the elongated surface precipitates, and shows that they are highly oriented with respect to the matrix. EDS on similar precipitates indicates that they are chemically virtually identical to the $Y_2O_3$ grains seen in the substrate interior (those which show Moire contrast). The diffraction pattern for this sample shows no additional features which could be caused by a new phase. The chemical and diffraction evidence, therefore, indicates that these surface precipitates are also $Y_2O_3$. These precipitates can also be seen with scanning electron microscopy (SEM), demonstrating that they have formed on the surface of the substrate. FIG. 9(b) shows a typical region of this sample in which surface precipitates of both types are evident. Note the alignment of both forms of surface precipitates.

Figure 10:
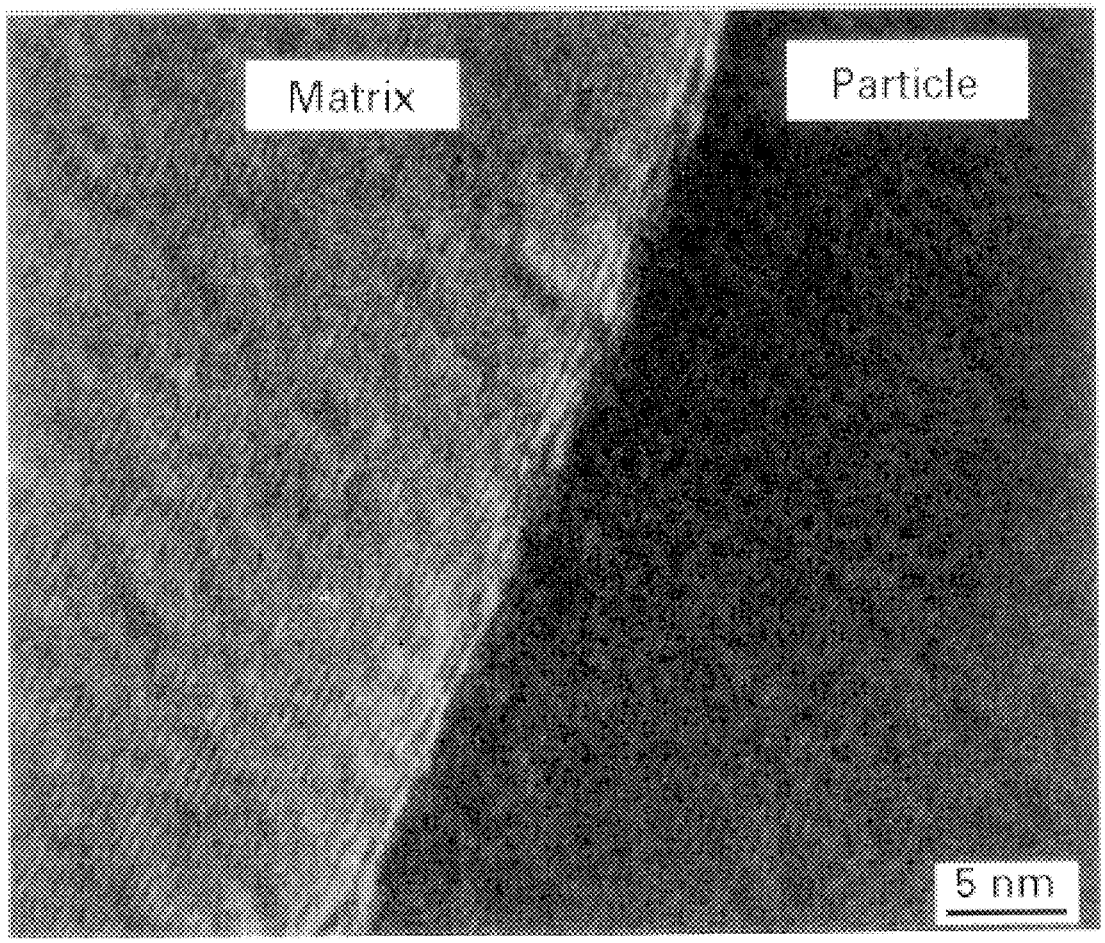
FIG. 10 is a TEM high resolution image of the 1400° C., 60 minute annealed sample, showing coherence of particle with matrix.
Figure 11:
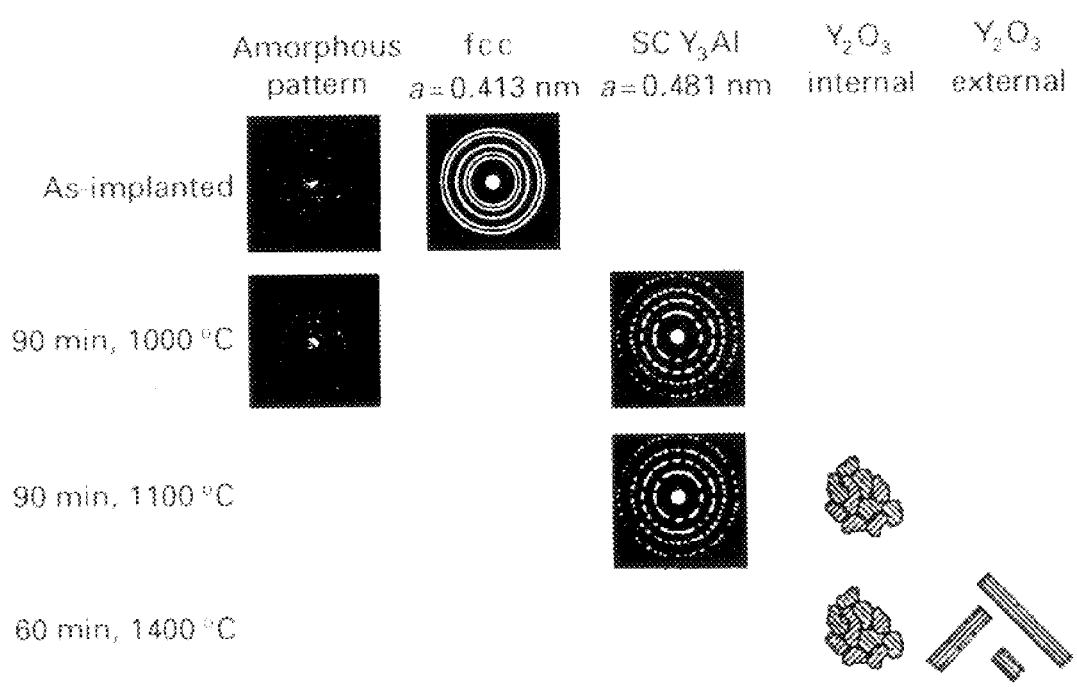
FIG. 11 is a graphic summary of the microstructures resulting from annealing.

The gradual recrystallization of the annealed samples, with higher temperature and longer time, along with the formation of surface precipitates in the final stages of recrystallization are shown in FIGS. 10 and 11. The formation of oriented internal grains of yttria was an unexpected and surprising result. While $In^+$ implanted alumina has been reported in the prior art as forming a dual phase $Al_2O_3/M_2O_3$ microstructure as a result of annealing in oxygen, the grains formed were not oriented and resulted only from a very high temperature anneal (1500° C.). A larger portion of the implantation and annealing studies conducted with alumina substrates report aluminate formation ($MAl_2O_4$ or $MAlO_3$) and either total or partial surface segregation of the implanted material. For example, $Ga^+$, $Zn^+$ and $Zr^+$ are entirely segregated to the surface of the recrystallized substrate where they form $GaAlO_3$, $ZnAl_2O_4$, and $ZrO_2$ respectively. $Mn^+$, $Ni^+$, and $Fe^+$ on the other hand, form both internal grains of their respective aluminates, ($MnAl_2O_4$, $NiAl_2O_4$, $FeAl_2O_4$) and surface precipitates of either the same aluminate or, in the case of iron, $Fe_2O_3$.

EXAMPLE II

1. Procedure

Ion implantation of calcium and yttrium into high-purity, single crystalline α-alumina has resulted in the formation of metallic aluminum nanoparticles in the implanted regions. The calcium implantations were carried out at accelerating energies of 50 and 70 keV and resulted in particles with average diameters of approximately 8.2 nm±1.4 nm. The yttrium was implanted at an accelerating energy of 150 keV and resulted in particles of approximately 10 nm±1.8 nm in diameter. The ion fluence for all implantations was $5\times10^{16}$ ions/cm$^2$.

Differential optical absorption measurements support the presence of nanoparticles in these samples. The spectra from the Ca implanted samples show absorption features at ~245 nm. The spectrum from the Y implanted sample shows a similar, but more intense absorption feature at 239 nm. The particles are face-centered cubic with a calculated lattice parameter of $a_o=0.41$ nm, and are randomly oriented and aluminum-rich with respect to the surrounding amorphous alumina matrix. Energy filtering transmission electron microscopy (EFTEM) results confirm the that the particles contain metallic aluminum, which is formed as a result of the reduction of the alumina matrix.

Electrically insulating solids with optical nonlinearities which are caused by the presence of small dispersoids (<10 nm in diameter) are promising candidates for applications in the area of optical waveguide technology. The optical responses of these materials are dominated by two effects. The small particles have a high surface area-to-volume ratio which enhances the surface plasmon resonance response, resulting in characteristic absorption bands. This effect is dominant when the particle size is greater than the mean free path of the electrons, which is on the order of tens of nm for most metallic particles (~37 nm for Al, assuming divalency). The second effect is known as quantum confinement. This phenomenon is most easily understood as a splitting of the typical energy bands of a metallic solid into discrete allowed energy levels due to the limited size of the particles. This energy level splitting causes the particles to behave electronically as a low band-gap material which is surrounded by the higher band-gap matrix material. This nonlinear effect becomes most prominent when the particle diameter is much smaller than the mean free path of the electrons.

Colloid formation in many materials can be induced by any mechanism that causes the introduction of a significant number of free metal ions. Ion implantation is clearly such a mechanism. The appearance of colloidal features in ceramic materials due to ion implantation has been reported for ion fluences ranging from $1\times10^{16}$ to $1\times10^{17}$ ions/cm$^2$. In the most common mechanism of colloid formation, the implantation creates a narrow layer of supersaturated matrix material. This supersaturated material experiences precipitation of the implanted ion(s) and the formation of nanocrystals which is induced either by implanting at elevated temperature or by post-implantation annealing. This type of colloid formation in alumina has been reported for implantations of gold, silver, copper, iron, nickel, manganese, silicon and germanium. Compound semiconductor crystals can also be formed in the same manner through consecutive implantation and precipitation.

Another mechanism by which excess metal ions can be introduced into a crystal lattice is irradiation-induced dissociation of the host material. A comprehensive examination of irradiation induced colloid formation indicates that metal particle formation (from the cation of the host lattice) due to either electron or neutron irradiation has been observed in alkali halides, azides, alkaline earth fluorides, and some oxides; specifically, lithia and alumina. The largest portion of this type of research has been carried out on alkali halides. Under electron or neutron irradiation these types of materials commonly experience the formation of cation clusters. For instance, Li colloids can be formed in LiF via electron irradiation at slightly elevated temperatures. This type of colloid formation via irradiation is not restricted to alkali halides. 1 MeV electron irradiation of single crystalline lithia ($LiO_2$) at room temperatures will produce Li colloids. Alumina may behave in the same manner. Irradiation of alumina with very high energy neutrons (14 MeV) results in the formation of charged and neutral lattice defects which may lead to the formation of particles. The formation of aluminum particles in alumina thin films irradiated at elevated temperatures with 1 MeV electrons also can occur.

The situation in this invention is a combination of the above circumstances. The substrate material ($Al_2O_3$) is implanted with a 'foreign' ion, much like the implantations resulting in particle formation via precipitation of the implanted ion. However, this implantation treatment results in the formation of colloidal particles composed of the cation of the host lattice (Al), which is a situation similar to the irradiated alkali halide and oxide examples mentioned above.

2. Experimental

The 1123 single crystal alumina substrates (99.99% pure) used in this example were obtained with an optical grade surface polish from Saphikon Inc. The 0.7 mm thick substrates were cut into 10 mm×10 mm samples and annealed at 1500° C. for 80 hours to remove residual polishing damage and ensure a crystalline structure throughout the substrate. The ion implantations were carried out at ambient temperature and at a vacuum of ~$1\times10^{-7}$ Torr. The samples were purposely misaligned with the incident beam to avoid ion channeling, and the current densities were kept low (between 0.5–2 µA) to avoid local beam heating. All samples received a fluence of $5\times10^{16}$ ions/$cm^2$. The $Y^+$ ions were implanted with an accelerating energy of 150 keV, yielding a range of approximately 50 nm and a local concentration of 9%, as predicted by PROFILE. The $Ca^+$ ions were implanted with accelerating energies of either 70 keV or 50 keV, yielding a local concentration of 10% at a range of 40 nm or 14% at a range of 30 nm respectively. Rutherford backscattering spectroscopy (RBS) with a 1.5 MeV beam of $^4He^+$ was used to examine the laterally averaged chemical profile of the implanted ions versus energy and the crystallinity of the yttrium implanted alumina substrate. These experiments were carried out at the Oak Ridge National Laboratory Surface Modification and Characterization Facility (SMAC).

The extent of the implanted damage was further examined using Knoop microhardness measurements in accordance with ASTM standard (E 384–89). Differential optical absorption spectra were used to detect the presence or absence of particles in the implanted substrates prior to additional examination by high resolution transmission electron microscopy (TEM). Electron transparent, plan view specimens were prepared using standard dimple grinding and ion beam milling techniques. Electron energy loss spectroscopy using a parallel detector (PEELS) and energy filtered TEM (EFTEM) were employed in order to determine the chemical nature and location of the elements present in the microstructure at a high resolution. TEM and PEELS were carried out on a Hitachi HF2000 TEM operated at 200 kV. EFTEM experiments were performed with a Gatan Imaging Filter (GIF TM) interfaced to a Philips CM30 TEM operated at 300 kV. The EFTEM work was performed in the Oak Ridge National Laboratory, Radiation Effects and Microstructural Analysis Group through the Shared Research Equipment Program (ShaRE).

3. Results

The Rutherford backscattering results, not shown, indicate that the implanted ion range predictions made by the PROFILE simulation program were reasonably accurate when surface sputtering is considered. The experimental ranges were found to be ~41 nm for the Y implantation and ~40 nm and 30 nm for the 70 keV and 50 keV Ca implantations.

Knoop microhardness tests show that the surface layer of all three implantations are amorphous. The relative hardness (implanted hardness/unimplanted hardness) of each sample was measured for loads ranging from 25–500 g. All samples, at all loads demonstrated relative hardness values less than 1. This is called absolute softening and is consistent with the presence of a surface amorphous layer. The amorphous layer was confirmed via RBS in channeling configuration for the Y implanted samples and was found to be 120 mn in thickness. The presence of the amorphous surface layer is an unexpected result for the calcium implantations considering that alumina is known to be difficult to fully amorphize except with large doses of heavy ions and/or implantation at reduced temperatures, neither of which apply in this circumstance. Some other strongly oxidizing elements, such as Zn and Zr have been shown to produce buried amorphous layers in alumina; however, those layers resulted from implantations of ions with much greater accelerating energies or a much higher fluence.

Figure 12:
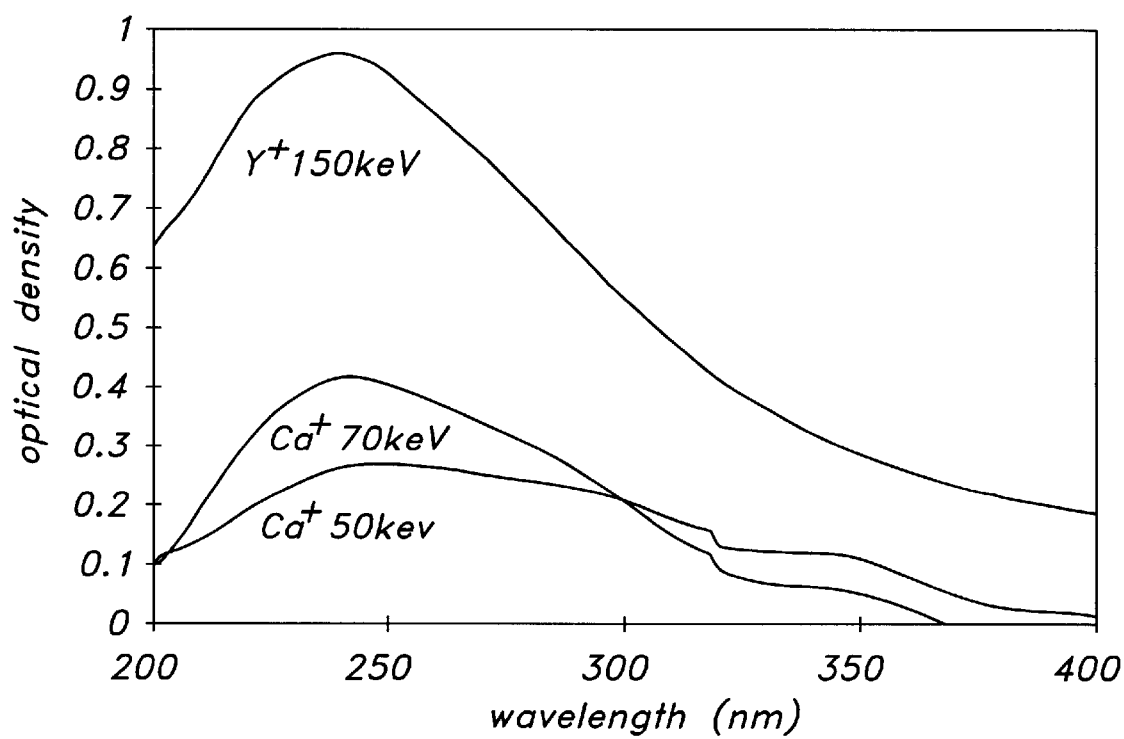
FIG. 12 is an optical absorption spectra from the implanted samples, showing the absorption feature caused by the presence of metallic colloids dispersed in the matrix.

Differential optical absorption was carried out on all three implanted samples in order to determine whether the samples contained metallic particles. These spectra show an absorption feature in the UV at roughly 240 nm, see FIG. 12. The absorption peak from the $Y^+$ implanted sample is the most intense and has a peak at 239 nm. The 70 keV and 50 keV $Ca^+$ implanted samples show less intense, broader peaks at 242 and 247 nm respectively.

TEM carried out on plan view specimens of the three implanted samples confirmed both the presence of amorphous material at the substrate surface and the presence of nanoscale particles. FIG. 13 shows that the particles are lightly diffracting, finely dispersed and spherical in shape. The unusual contrast demonstrated by some of the particles, in which the periphery of the particle appears brighter than the interior when viewed with 15 eV-loss electrons in EFTEM, is not yet fully understood. It could be due either to compositional variation or to differing diffraction conditions between the inner and outer edges of the particles. The 150 keV $Y^+$ implanted sample contains 10.7±1.8 nm diameter particles, and the 70 and 50 keV $Ca^+$ implanted samples contain 8.8±1.2 nm and 7.5±1.4 nm diameter particles respectively. The electron diffraction patterns associated with these particles show that they are randomly oriented in the plane and have a face centered cubic (fcc) structure. The electron diffraction patterns yield lattice parameters of 0.410±0.004 nm, 0.413±0.004 nm and 0.409±0.004 nm respectively. The lattice parameter of pure (fcc) aluminum is 0.40497 nm, which indicates that the particles formed via ion implantation are aluminum with a dilated lattice parameter which may reflect some trapping of the implanted ion within the Al particles.

Figure 14A:
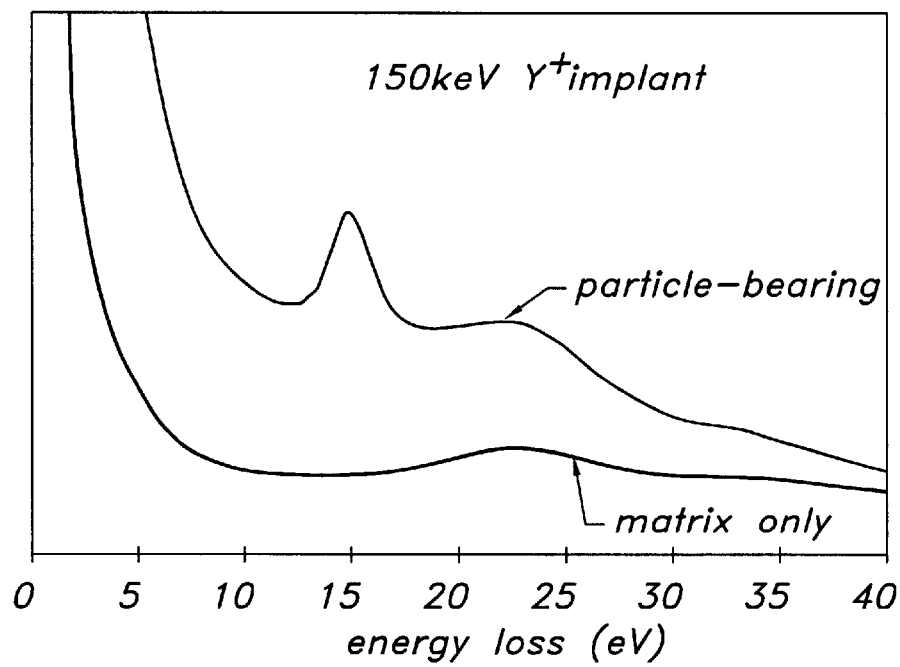
Figure 14B:
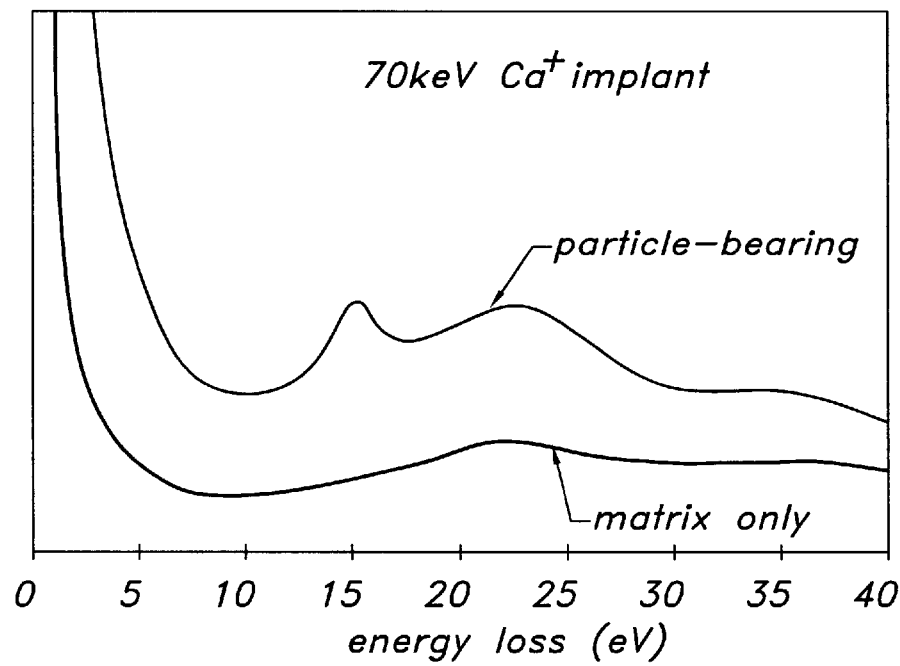

Chemical analysis of these samples using energy dispersive X-ray spectroscopy (EDS) indicates that the particles are aluminum rich with respect to the surrounding matrix. To obtain more spatially accurate chemical information, high resolution PEELS and EFTEM experiments were conducted. The low energy loss spectra from the 150 keV $Y^+$ and the 70 keV $Ca^+$ implanted samples are shown in FIGS. 14a and 14b, respectively. The broad loss feature at ~25 eV visible in all four spectra is the characteristic electron energy loss caused by interaction with oxidized aluminum. The sharp shoulder feature at ~15 eV in the spectra taken from a particle bearing region in both cases is the characteristic energy loss associated with metallic aluminum. This result, therefore indicates that these particles are composed predominantly of metallic aluminum. Note that the spectra taken from a particle in each sample also contains the 25 eV alumina energy loss feature because the particles in question are embedded in the alumina matrix material, making it impossible to acquire a spectrum from a particle which does not also include the matrix above and/or below the particle.

Energy filtered TEM produces chemically sensitive images which show the spatial distribution of the electrons which experience a selected energy loss. The resolution of this technique can be much better than other chemically sensitive imaging techniques, and, in this case is approximately 2 nm. The images are formed by separating the electrons with different energy losses at the exit face of an EELS spectrometer and introducing an energy selecting system that allows only the electrons with a specific energy loss to pass through the imaging system, and finally redispersing the electrons with a set of magnetic lenses in correspondence to their real space distribution. The implanted samples were imaged in this way, using the energy-loss spectra obtained with PEELS as a guide. The results from the 50 keV Ca$^+$ implanted sample are presented here in FIG. 15; the yttrium implantation resulted in similar images. When imaged using 15 eV-loss electrons, the particles in the implanted areas appear bright. When imaged using 25 eV-loss electrons, the same areas appear dark, indicating they contain less oxidized aluminum than the surrounding matrix. This set of images confirms that the particles contain metallic aluminum, and, in conjunction with the PEELS and TEM data, also indicates that the adjacent amorphous matrix material contains aluminum in its oxidized state. This conclusion is further supported by the result of an elemental map of oxygen from a similar region which shows that the particles are oxygen deficient with respect to the surrounding matrix. Again, it is impossible, due to sample configuration, to obtain an image that does not include the matrix material above and/or below the particles, making it impossible to show if the particles are totally lacking in oxygen.

4. Discussion

The diffraction PEELS, TEM and EFTEM results all show that there are Al particles embedded in the alumina substrate. The differential optical absorption measurements agree with this conclusion as well. Using the Mie theory for absorption by small metal particles and following the calculations of Smithard et. al., Helvetica Physica Acta, 46, 869–888 (1974), it can be shown that the wavelength at which the maximum absorption ($\lambda_{peak}$) due to colloidal metal particles occurs is given by, $$\lambda_{peak} = \frac{2\pi c}{\omega_p}(\varepsilon_o + 2n_o^2)^{\frac{1}{2}} \quad (1)$$

and the equation for the width of this absorption peak is given by, $$\Delta\lambda = \frac{4\pi c \omega_o}{2\omega_p^2}(\varepsilon_o + 2n_o^2) \quad (2)$$

where:
$\omega_p$=plasmon frequency of the bulk metal
$\varepsilon_0$=value of $\varepsilon_1$ (the real dielectric const.) at infinite frequency
$n_0$=index of refraction of the matrix material
$\omega_0$=collision frequency of the electrons in the metal Equation (1) yields a wavelength for maximum absorption due to Al particles embedded in an alumina matrix of $\lambda_{peak}$=218 nm using values of $\varepsilon_0$=1, $n_0$=1.76 and $\omega_p$=2.309× $10^{16}$ S$^{-1}$. This value is lower than the experimental absorption of approximately 240 nm; however, a number of factors must be taken into account. The first and most obvious consideration is that the implantation of ions into the matrix material will increase the index of refraction ($n_0$) in the surface region where the particles reside. An increase of 0.2 (from 1.76 to 1.96) results in a calculated $\lambda_{peak}$=240 nm. It must also be considered that the electron collision frequency ($\omega_0$) for small particles will be larger than for the bulk material because the electrons will also collide with the particles' surfaces. Thus, the peak wavelength $\lambda_{peak}$ and the peak width $\Delta\lambda$ are particle size dependent, and will increase as the particle size decreases. The effect of particle size on the peak width is significant; however the peak wavelength dependence on particle size (in this size regime) is quite small. Therefore, only the slight shifts of the peak positions toward higher wavelengths with decreasing particle size from ~11 nm to 7 nm may be explained by the particle size dependence of $\lambda_{peak}$. The apparent increase of the peak widths with decreasing particle size is also consistent with the dependence of $\beta\lambda$ on particle size.

The production of aluminum particles by both the yttrium and calcium implantations suggests that the alumina substrate is reduced by the implanted ion, resulting in free aluminum atoms which cluster together to form the resulting particles. The plausibility of the reduction of alumina may be demonstrated by using tabulated values of entropy and enthalpy to calculate the free energy versus temperature of the reactions:

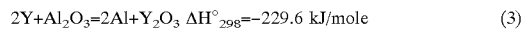
2Y+Al$_2$O$_3$=2Al+Y$_2$O$_3$ ΔH°$_{298}$=−229.6 kJ/mole (3)

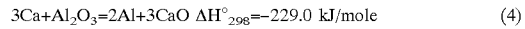
3Ca+Al$_2$O$_3$=2Al+3CaO ΔH°$_{298}$=−229.0 kJ/mole (4)

In the temperature range reasonable for these ambient temperature implantations (298–1000 K) the free energy for these reactions is negative, and therefore thermodynamically possible. Conversely, similar calculations carried out for ion implantations which do not result in aluminum particles indicate that the free energy for these reactions is positive over the temperature ranges in which the implantations took place. Gold, when implanted into alumina at ambient temperature will form gold particles in the matrix. Iron, nickel, copper and manganese ambient temperature implantations showed no particle formation prior to annealing. Upon annealing in an oxidizing atmosphere many of these showed oxide or aluminate particle formation at or near the surface, whereas upon annealing in a reducing atmosphere only nickel and iron demonstrated the formation of crystalline particles composed of the implanted ion. We have conducted additional implant experiments with other elements not expected to reduce the alumina substrate, such as Ti and Cr. These implantations, as expected, did not result in aluminum particle formation.

Yttrium and calcium ion implantation into alumina to a dose of 5×10$^{16}$ ions/cm$^2$ at energies of 150 keV, and 70 and 50 keV, respectively, produce an amorphous surface layer containing metallic aluminum particles ranging in size from ~7–10 nm. These particles are face-centered cubic and demonstrate a slightly dilated lattice parameter from pure aluminum possibly due to the incorporation of a small amount of the implanted ion. The apparent mechanism of formation appears to be reduction of the alumina matrix material followed by clustering of the resulting free aluminum atoms. Therefore, a third mechanism for the production of colloids in insulating solids is proposed; reduction, in which ion implantation of an element which is more oxygen reactive than the substrate cation causes reduction of the substrate cation.

While the invention has been explained in relation to its preferred embodiments, it is to be understood that various modifications thereof will become apparent to those skilled in the art upon reading this specification. The aforementioned examples and embodiments are therefore, to be considered in all respects as illustrative rather than restrictive, and the invention is not to be limited to the details given therein. Therefore, it is to be understood that the invention disclosed herein is intended to cover such modifications as fall within the scope of the invention.

What is claimed is:

1. A method for ion implantation comprising:

a. providing a solid oxide substrate material;

b. providing a fluence of positively charged ions to said substrate material; and c. implanting said ions into said substrate material;

wherein a reduction occurs between said ions and said substrate material thereby forming particles comprising metal ions from said substrate material.

2. A method as claimed in claim 1, wherein said substrate material is selected from the group consisting of $Al_2O_3$, MgO, $SiO_2$, and $ZrO_2$.

3. A method as claimed in claim 2, wherein said ion is selected from the group consisting of $In^+$, $Y^+$, $Al^+$, $Mn^+$, $Ni^+$, $Fe^+$, $Zr^+$, $Mg^+$, $Zn^+$, and $Ga^+$.

* * * * *